US012412539B2

(12) United States Patent
Chiou et al.

(10) Patent No.: US 12,412,539 B2
(45) Date of Patent: Sep. 9, 2025

(54) METHOD AND DEVICE FOR ADJUSTING UNIFORMITY OF DISPLAY AND ELECTRONIC DEVICE USING THE SAME

(71) Applicant: Qisda Corporation, Taoyuan (TW)

(72) Inventors: Yi-Wen Chiou, Taoyuan (TW);
Shih-Yao Lin, Taoyuan (TW);
Chun-Fu Chen, Taoyuan (TW);
Lung-Li Chung, Taoyuan (TW);
Chen-Ning Liao, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 413 days.

(21) Appl. No.: 17/704,115

(22) Filed: Mar. 25, 2022

(65) Prior Publication Data

US 2023/0240024 A1  Jul. 27, 2023

(30) Foreign Application Priority Data

Jan. 25, 2022  (CN) .......................... 202210087858.0

(51) Int. Cl.
G09G 3/36 (2006.01)
G01B 21/22 (2006.01)
H05K 5/00 (2006.01)
H05K 5/02 (2006.01)
G06F 3/14 (2006.01)

(52) U.S. Cl.
CPC .............. G09G 3/36 (2013.01); G01B 21/22 (2013.01); H05K 5/0017 (2013.01); H05K 5/0217 (2013.01); *G06F 3/1407* (2013.01); *G09G 2320/0233* (2013.01); *G09G 2320/0242* (2013.01); *G09G 2320/0285* (2013.01); *G09G 2320/0626* (2013.01); *G09G 2320/0666* (2013.01)

(58) Field of Classification Search
CPC .............................. G06F 3/1407; G09G 3/36; G09G 2320/0233; G09G 2320/0242; G09G 2320/0285; G09G 2320/0626; G09G 2320/0666; H05K 5/0217; H05K 5/0017; G01B 21/22
See application file for complete search history.

(56) References Cited

U.S. PATENT DOCUMENTS

| | | | | |
|---|---|---|---|---|
| 10,204,592 | B1 * | 2/2019 | Trim | G06F 1/1601 |
| 2007/0236517 | A1 * | 10/2007 | Kimpe | G09G 3/2092 |
| | | | | 345/690 |
| 2015/0245043 | A1 * | 8/2015 | Greenebaum | H04N 19/188 |
| | | | | 375/240.25 |
| 2018/0262658 | A1 * | 9/2018 | Häger | H04N 23/20 |
| 2019/0052872 | A1 * | 2/2019 | Shyshkin | G09G 3/006 |

\* cited by examiner

*Primary Examiner* — William Boddie
*Assistant Examiner* — Saifeldin E Elnafia

(57) ABSTRACT

A method for adjusting the uniformity of a display is provided. The method includes the following steps. An angle sensor is disposed on a display. The display opposite to a measurement device is disposed on a rotation axis. The uniformity of a frame of the display at at least one use angle is measured by the measurement device, wherein the display is adjusted to a first use angle and is left still for a period of time, so that the uniformity of the display arranged at the first use angle has a first uniformity correction parameter; and a correspondence table relevant to the first use angle and the first uniformity correction parameter is stored to the display.

17 Claims, 5 Drawing Sheets

METHOD AND DEVICE FOR ADJUSTING UNIFORMITY OF DISPLAY AND ELECTRONIC DEVICE USING THE SAME

This application claims the benefit of People's Republic of China application Serial No. 202210087858.0, filed Jan. 25, 2022, the subject matter of which is incorporated herein by reference.

BACKGROUND OF THE INVENTION

Field of the Invention

The invention relates in general to an electronic device, and more particularly to a method and a device for adjusting the uniformity of a display and an electronic device using the same.

Description of the Related Art

Liquid crystal (LC) is an anisotropic substance whose state is between liquid and solid, so that liquid crystal molecules possess the properties of birefringence ($\Delta n$) and dielectric anisotropy ($\Delta \varepsilon$). Additionally, a polarizer, which is an optical element widely used in liquid crystal display (LCD), allows the light with a single polarization direction to pass through, so that the light perpendicular to the single polarization direction can be absorbed. The polarizer controls the penetration of the light with a specific polarization direction and therefore produces the dark/bright state of a liquid crystal display panel.

Referring to FIG. 1, a uniformity diagram of liquid crystal 12 of a conventional display 10 is shown. Due to the properties of the architecture of a liquid crystal panel, the liquid crystal 12 normally moves downward because of the gravity (known as gravitational vertical flow) and leads to an overall change in luminance of the display. Such change will affect the adjusted uniformity of the display. Since the causes of the gravitational vertical flow may be relevant with the delivery of the display 10 or the user's customized configuration, chroma deviation or luminance deviation may occur to the adjusted uniformity of the panel. Such deviation needs to be improved.

SUMMARY OF THE INVENTION

The invention is directed to a method and a device for adjusting the uniformity of a display and an electronic device using the same capable of dynamically adjusting the uniformity of the display according to the uniformity correction parameters for different use angles measured in advance to achieve a better visual effect.

According to one embodiment of the present invention, a method for adjusting the uniformity of a display is provided. The method includes the following steps. An angle sensor is disposed on a display. The display is disposed on a rotation axis and opposite to a measurement device. The frame uniformity of the display at at least one use angle is measured by the measurement device, wherein when the display is adjusted to a first use angle and is left still for a period of time, the uniformity of the display arranged at the first use angle has a first uniformity correction parameter, and a correspondence table relevant to the first use angle and the first uniformity correction parameter is stored to the display.

According to another embodiment of the present invention, a uniformity adjusting device used in a display is provided. The uniformity adjusting device includes an angle sensor, a stand and a measurement device. The angle sensor is disposed on the display. The stand has a rotation axis on which the display is placed. The measurement device, opposite to the display, measures the frame uniformity of the display at at least one use angle, wherein when the display is adjusted to a first use angle and is left still for a period of time, the uniformity of the display arranged at the first use angle has a first uniformity correction parameter, and a correspondence table relevant to the first use angle and the first uniformity correction parameter is stored to the display.

According to an alternate embodiment of the present invention, an electronic device is provided. The electronic device includes a display and an angle sensor. The display has a storage unit. The angle sensor is disposed on the display to detect a use angle of the display for adjusting the uniformity of the display. The storage unit is configured to store a correspondence table of uniformity correction parameters obtained when the frame of the display is arranged at at least one use angle.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention.

Figure 1:
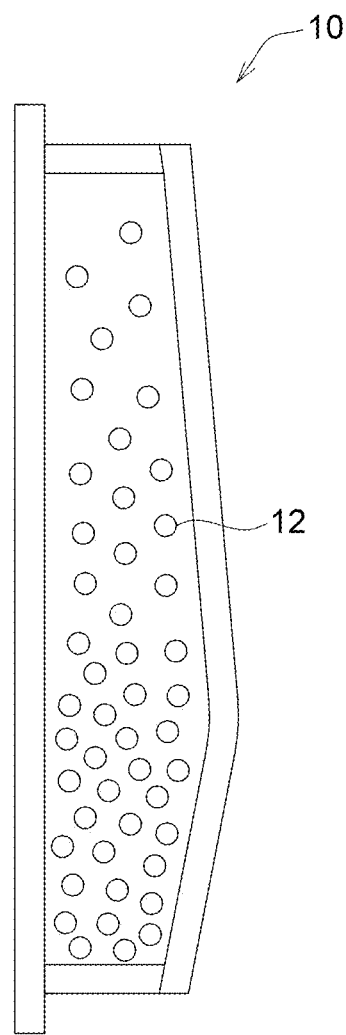
FIG. 1 is a uniformity diagram of liquid crystal molecules of a conventional display.
Figure 2A:
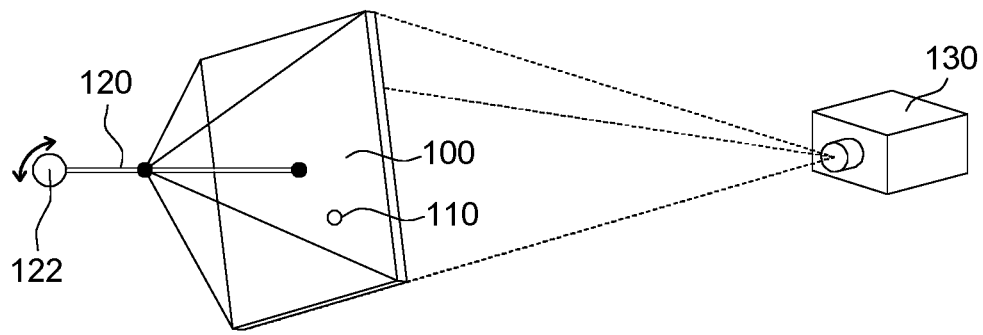
FIG. 2A is a schematic diagram of a uniformity adjusting device according to an embodiment of the present invention.
Figure 2B:
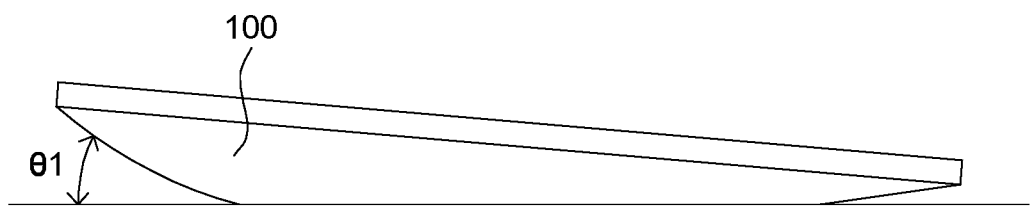
FIG. 2B and FIG. 2C are schematic diagrams of a display arranged at an elevation configuration.
Figure 2C:
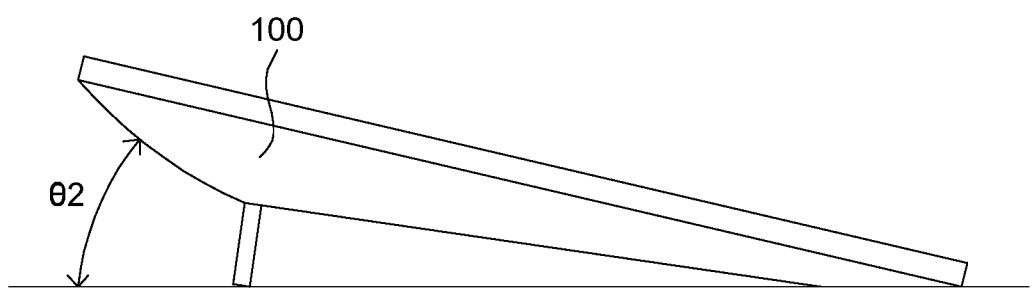

FIG. 2A is a schematic diagram of a uniformity adjusting device 101 according to an embodiment of the present invention. FIG. 2B and FIG. 2C are schematic diagrams of a display 100 arranged at an elevation configuration. Refer to FIG. 2A. The uniformity adjusting device 101 is used in a display 100, and includes an angle sensor 110, a stand 120 and a measurement device 130. The angle sensor 110 can be a sensing device, such as gyroscope or accelerator, and is configured to sense the current state of the display 100 (including angle/direction). Since the use angle and configuration of the display 100 (such as upright configuration, horizontal configuration or elevation configuration) affects the uniformity of liquid crystal molecules inside the panel, at least one angle sensor 110 needs to be disposed on the display 100 to obtain the current state of the display 100. In FIG. 2A, the display 100 can be a display arranged at an upright configuration. In FIG. 2B and FIG. 2C, the display 100 can be implemented by a writing pad or a tablet whose elevation angle can be adjusted according to the user's needs. The elevation angle can have a first use angle θ1 and a second use angle θ2.

Refer to FIG. 2A. The angle sensor 110 can be disposed at any position of the display 100 or in-built inside the display 100. The position of the angle sensor 110 can vary with the change of the use angle of the display 100. For example, when the display 100 is at a vertical state, the angle sensor 110 is at a first position and forms a first use angle with respect to a vertical plane or a horizontal plane; when the display 100 is at a horizontal state, the angle sensor 110 is at a second position and forms a second use angle with respect to a vertical plane or a horizontal plane. Therefore, the angle sensor 110 can sense the rotation angle of the display 100 (includes pitch angle, yaw angle, roll angle) and also can sense the state of the display 100 (such as vertical state, horizontal state or elevation state) for determining the use angle and direction of the display 100.

Figure 3A:
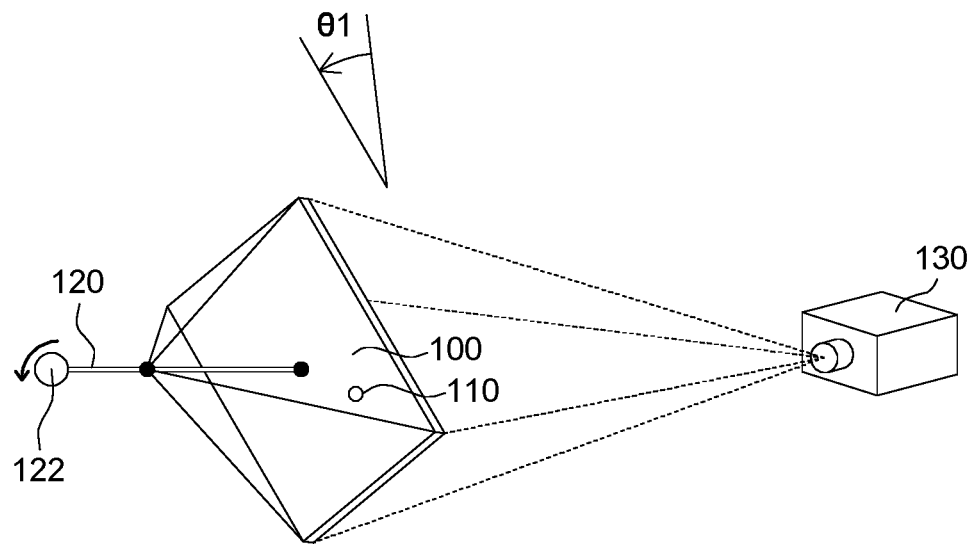
FIG. 3A and FIG. 3B respectively are schematic diagrams of a method for adjusting uniformity according to an embodiment of the present invention.
Figure 3B:
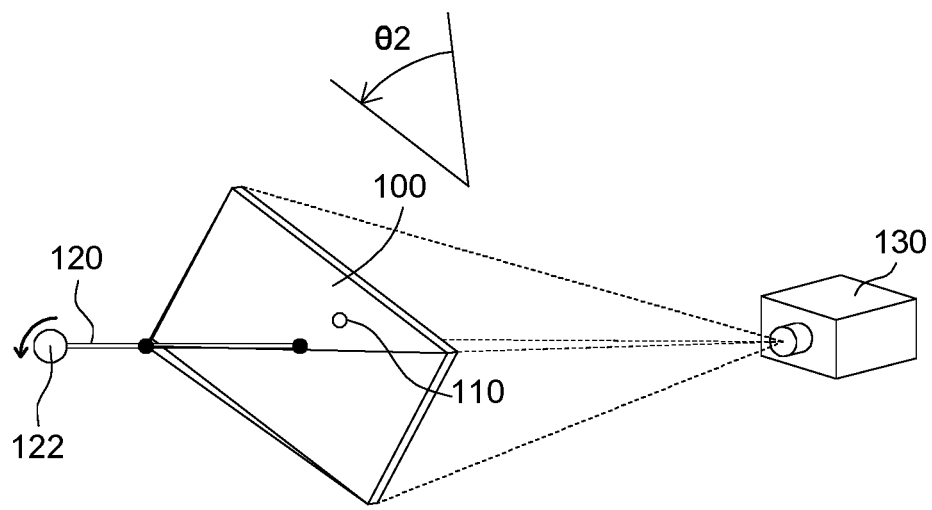

Refer to FIG. 3A and FIG. 3B. The stand 120 has a rotation axis 122, and is configured to fix and place the display 100 on the rotation axis 122. In the present embodiment, the stand 120 is not limited to a specific type, and any type would do as long as the stand 120 can fix the display 100 and make the display 100 rotate with respect to the rotation axis 122 according to the arrangement. The rotation axis 12 can be implemented by a ball joint or a rotating mechanism with multi-directional adjustment (including the rotations in upward, downward, leftward and rightward directions and the rotation around the center of the display 100) and is configured to make the display 100 generate various possible use angles and directions. Besides, the measurement device 130 is opposite to the display 100 to measure the frame uniformity of the display 100 at at least one use angle.

As indicated in FIG. 3A, the display 100 is adjusted to a first use angle θ1 and left still for a period of time, so that the display 100 will not have the vertical flow phenomenon of liquid crystal, and the uniformity of the display 100 at the first use angle θ1 is measured by the measurement device 130. Next, as indicated in FIG. 3B, the display 100 is adjusted to a second use angle θ2 and left still for a period of time, so that the display 100 will not have the vertical flow phenomenon of liquid crystal, and the uniformity of the display 100 at the second use angle θ2 is measured by the measurement device 130.

In an embodiment, the measurement device 130 can be implemented by a luminance/chroma measurement device (including a luminance meter and a color temperature colorimeter). The colorimeter is a spectrum analyzer for measuring the color temperature and color of an object. The colorimeter determines the color of an object according to the red, blue and green composition of the spectrum absorbed by the object. The luminance meter can measure the intensity of a visible light with any wavelengths. In the present embodiment, the luminance meter and the color temperature colorimeter can be used together to analyze whether the chroma and luminance of each display pixel of the display 100 are uniform or not.

For instance, the screen of the display 100 is divided into 9 regions, and a chroma/luminance uniformity test is performed on each of the 9 regions. After the measurement device 130 finishes the uniformity test, the screen will show the difference in chroma and luminance between the 9 regions of the display 100 at different grayscale values. The equivalent line represents the characteristics and distribution of luminance/chroma uniformity.

Figure 4A:
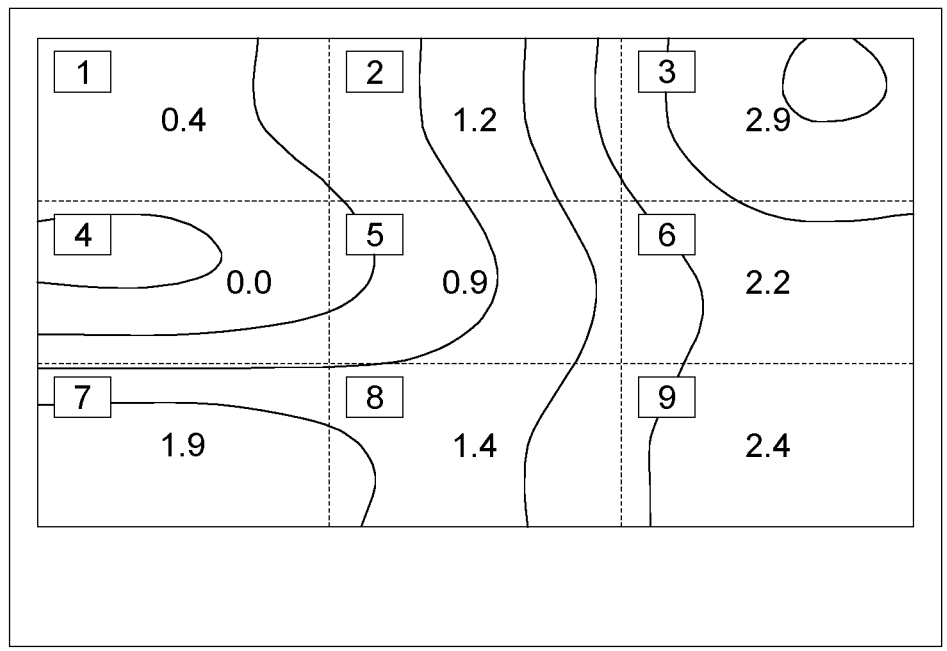
FIG. 4A and FIG. 4B respectively are schematic diagrams of chroma uniformity and luminance uniformity according to an embodiment of the present invention.
Figure 4B:
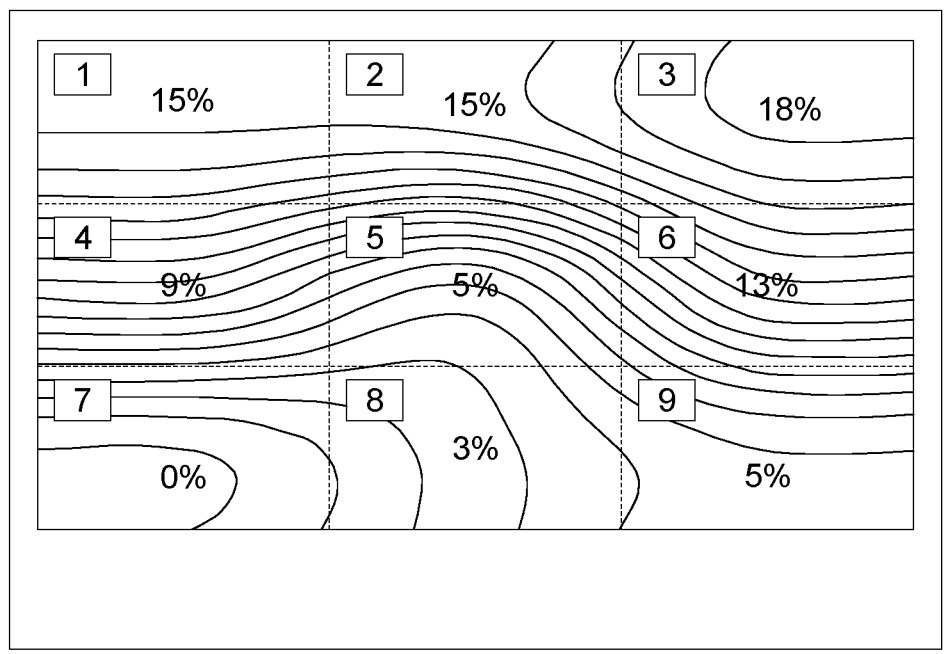

Referring to FIGS. 4A and 4B, schematic diagrams of chroma uniformity and luminance uniformity according to an embodiment of the present invention are respectively shown. In FIG. 4A, the screen of the display 100 is divided into 9 regions, and the measurement device 130 obtains the chroma coordinates of each block in the chroma test to determine the performance of the display 100 in terms of chroma uniformity. It can be known from the distribution of equivalent lines that the color temperature of region 4 at the left of the screen is closest to the standard color temperature and has a minimum difference of 0.0; the difference between the color temperature of region 3 at the top right of the screen and the standard color temperature is larger than 2 and the maximum difference is 2.9. In FIG. 4B, the measurement device 130 obtains the luminance of each block to determine the performance of the display 100 in terms of luminance uniformity. It can be known from the distribution of equivalent line that, the region 7 at the bottom left of the screen has the largest luminance, the region 3 at the top right of the screen has the smallest luminance, and the difference in luminance is about 18%.

The chroma and luminance uniformity can be the chroma and luminance uniformity obtained when the frame of the display 100 is a pure white frame or when the frame of the display 100 is a color frame of any of the red, blue and blue colors. In the present embodiment, uniformity correction parameters can be obtained by measuring the difference in the chroma and luminance uniformity of RGB colors between each region of the display 100 and can be used to correct the uniformity of each color of the display 100.

Figure 5:
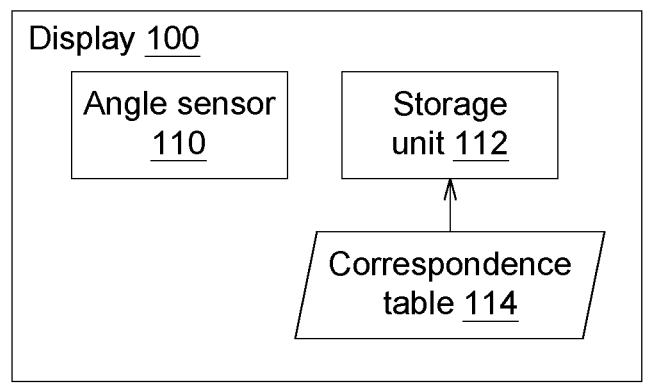
FIG. 5 is a schematic diagram of an electronic device according to an embodiment of the present invention.

In FIGS. 3A and 3B, after the uniformity correction parameters when the display 100 at different angles are obtained (for example, after the first uniformity correction parameter when the display 100 is at the first use angle 81 is obtained and the second uniformity correction parameter when the display 100 is at the second use angle θ2 is obtained), a correspondence table 114 can be stored to the storage unit 112 of the display 100 as indicated in FIG. 5.

Referring to FIG. 5, a schematic diagram of an electronic device according to an embodiment of the present invention is shown. The electronic device 102 includes a display 100 and an angle sensor 110. The display 100 has a storage unit 112, such as a flash memory. The angle sensor 110 can be implemented by a gyroscope or an accelerator. The angle sensor 110 is disposed on the display 100 to detect a use angle of the display 100 for adjusting the uniformity of the display 100. The storage unit 112 is configured to store a correspondence table 114 of uniformity correction parameters obtained when the frame of the display 100 is arranged at at least one use angle.

For example, when the display 100 is used at the first use angle θ, a correspondence table 114 relevant to the first use angle θ1 and the first uniformity correction parameter is stored to the display 100, wherein the first uniformity correction parameter is configured to adjust the chroma and luminance uniformity of the display 100 at the first use angle θ1, so that the uniformity of the display 100 will not be affected by the vertical flow phenomenon of the liquid crystal. Also, when the display 100 is used at the second use angle θ2, a correspondence table 114 relevant to the second use angle θ2 and the second uniformity correction parameter is stored to the display 100, wherein the second uniformity correction parameter is configured to adjust the chroma and luminance uniformity of the display 100 at the second use angle θ2, so that the uniformity of the display 100 will not be affected by the vertical flow phenomenon of liquid crystal.

The method and the device for adjusting uniformity and the electronic device using the same disclosed in above embodiments of the present invention are capable of dynamically adjusting the uniformity of the display according to the uniformity correction parameters for different use angles measured in advance. If the use angles of the display meet the requirements, the uniformity correction parameters can then be obtained from a look-up table and used to change the chroma and luminance uniformity to achieve a better visual effect.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for adjusting chroma uniformity of a display, comprising:
    disposing an angle sensor on a display;
    placing the display on a rotation axis, wherein the display is opposite to a measurement device;
    measuring uniformity of a frame of the display at at least one use angle by the measurement device, comprising:
    adjusting the display to a first use angle and leaving the display still for a period of time, so that the uniformity of the display arranged at the first use angle has a first uniformity correction parameter; and
    storing a correspondence table relevant to the first use angle and the first uniformity correction parameter to the display,
    wherein the frame of the display is divided into a plurality of regions, and the measurement device determines color temperature differences of various regions in terms of a chroma uniformity to obtain the first uniformity correction parameter and shows the color temperature differences by a distribution of equivalent lines.

2. The method for adjusting the uniformity of the display according to claim 1, further comprising adjusting the display to a second use angle and leaving the display still for a period of time, so that the uniformity of the display arranged at the second use angle has a second uniformity correction parameter, and storing another correspondence table relevant to the second use angle and the second uniformity correction parameter to the display.

3. The method for adjusting the uniformity of the display according to claim 1, wherein the chroma uniformity is obtained when the frame of the display is a pure white frame.

4. The method for adjusting the uniformity of the display according to claim 1, wherein the chroma uniformity is obtained when the frame of the display is a color frame of any one of red, green and blue colors.

5. The method for adjusting the uniformity of the display according to claim 1, wherein the first uniformity correction parameter is configured to adjust the chroma uniformity of the display arranged at the first use angle.

6. A display uniformity adjusting device used in a display, wherein the display uniformity adjusting device comprises:
    an angle sensor disposed on the display;
    a stand having a rotation axis configured to place the display on the rotation axis; and
    a measurement device opposite to the display;
    wherein, the measurement device measures chroma uniformity of a frame of the display at at least one use angle, comprising:
        adjusting the display to a first use angle and leaving the display still for a period of time, so that the chroma uniformity of the display arranged at the first use angle has a first uniformity correction parameter; and
        storing a correspondence table relevant to the first use angle and the first uniformity correction parameter to the display,
        wherein the frame of the display is divided into a plurality of regions, and the measurement device determines color temperature differences of various regions in terms of the chroma uniformity to obtain the first uniformity correction parameter and shows the color temperature differences by a distribution of equivalent lines.

7. The display uniformity adjusting device according to claim 6, wherein the angle sensor is a gyroscope or an accelerator.

8. The display uniformity adjusting device according to claim 6, wherein the rotation axis is a ball joint.

9. The display uniformity adjusting device according to claim 6, wherein the measurement device is a chroma measurement device.

10. The display uniformity adjusting device according to claim 6, wherein the chroma uniformity is obtained when the frame of the display is a pure white frame.

11. The display uniformity adjusting device according to claim 6, wherein the chroma uniformity is obtained when the frame of the display is a color frame of any one of red, green and blue colors.

12. The display uniformity adjusting device according to claim 6, wherein the first uniformity correction parameter is configured to adjust the chroma uniformity of the display arranged at the first use angle.

13. An electronic device, comprising:
    a display having a storage unit; and
    an angle sensor disposed on the display to detect a use angle of the display for adjusting uniformity of the display;
    wherein, the storage unit is configured to store a correspondence table of uniformity correction parameters obtained when a frame of the display is arranged at at least one use angle,
    wherein the frame of the display is divided into a plurality of regions, and color temperature differences of various regions in terms of a chroma uniformity is determined to obtain the uniformity correction parameter and the color temperature differences are shown by a distribution of equivalent lines.

14. The electronic device according to claim 13, wherein the angle sensor is a gyroscope or an accelerator.

15. The electronic device according to claim 13, wherein the chroma uniformity is obtained when the frame of the display is a pure white frame.

16. The electronic device according to claim 13, wherein the chroma uniformity is obtained when the frame of the display is a color frame of any one of red, green and blue colors.

17. The electronic device according to claim 13, wherein the uniformity correction parameter is configured to adjust the chroma uniformity of the display arranged at the use angle.

* * * * *